US00RE35154E

United States Patent [19]

Hardee

[11] E Patent Number: Re. 35,154

[45] Reissued Date of Patent: Feb. 13, 1996

[54] BIT LINE AND COLUMN CIRCUITRY USED IN A SEMICONDUCTOR MEMORY

[75] Inventor: Kim C. Hardee, Colorado Springs, Colo.

[73] Assignee: Thorn EMI North America, Inc., Wilmington, Del.

[21] Appl. No.: 382,178

[22] Filed: Jul. 19, 1989

Related U.S. Patent Documents

Reissue of:

[64] Patent No.: 4,791,613
Issued: Dec. 13, 1988
Appl. No.: 633,091
Filed: Jul. 25, 1984

U.S. Applications:

[63] Continuation-in-part of Ser. No. 534,484, Sep. 21, 1983, abandoned.

[51] Int. Cl.[6] ..... G11C 7/00; G11C 11/419

[52] U.S. Cl. ..... 365/189.09; 365/190; 365/203

[58] Field of Search ..... 365/189.09, 190, 365/203, 205, 207, 208, 204, 189.11; 307/530; 327/51, 52, 53

[56] References Cited

U.S. PATENT DOCUMENTS

| | | | |
|---|---|---|---|
| 4,045,785 | 8/1977 | Kirkpatrick, Jr. | 365/208 |
| 4,062,000 | 12/1977 | Donnelly | 365/203 |
| 4,090,255 | 5/1978 | Berger et al. | 365/154 |
| 4,131,951 | 12/1978 | Asahi | 365/203 |
| 4,195,356 | 3/1980 | O'Connell et al. | 365/189.09 |
| 4,255,678 | 3/1981 | Suzuki et al. | 365/190 |
| 4,322,820 | 3/1982 | Toyoda | 365/154 |
| 4,355,377 | 10/1982 | Sud et al. | 365/190 |
| 4,379,344 | 4/1983 | Ozawa et al. | 365/190 |
| 4,386,419 | 5/1983 | Yamamoto | 365/190 |
| 4,387,447 | 6/1983 | Klaas et al. | 365/203 |
| 4,451,907 | 5/1984 | Donghue et al. | 365/190 |
| 4,453,235 | 6/1984 | Chao | 365/189.09 |
| 4,460,985 | 7/1984 | Hoffman | 365/207 |
| 4,499,559 | 2/1985 | Kurafuji | 365/190 |
| 4,504,748 | 3/1985 | Oritani | 365/208 |

FOREIGN PATENT DOCUMENTS

| | | |
|---|---|---|
| 0028157 | 5/1981 | European Pat. Off. . |
| 54-148442 | 11/1979 | Japan . |
| 55-132589 | 10/1980 | Japan . |
| 57-117181 | 7/1982 | Japan . |
| 2092403 | 8/1982 | United Kingdom . |

OTHER PUBLICATIONS

IBM Technical Disclosure Bulletin, vol. 21, No. 2 (Jul. 1978) Beranger et al. "Read Circuit In A Memory Using Harper Cells", pp. 642–643.

Patent Abstracts of Japan, vol. 5, No. 130, (P–76) (802), Aug. 20, 1981, JP–A–56 068 991 (Hitachi Seisakusho K.K.) Sep. 6, 1981.

The Semiconductor Memory Book, Intel Marketing Communications, John Wiley & Sons, New York, 1978; pp. 20–25, J. Oliphant: "Designing Non–Volatile Semiconductor Memory Systems" (p. 23, Col. 2, paragraph 2; p. 24, FIG. 8).

(List continued on next page.)

*Primary Examiner*—Glenn Gossage
*Attorney, Agent, or Firm*—Edward D. Manzo; Ted K. Ringsred

[57] ABSTRACT

Column circuitry for a CMOS static RAM includes a bit line clamp combined with a bit line current source regulated by a voltage reference which tracks changes in transistor characteristics. Separate data read and data write lines are provided, with a differential amplifier for each pair of bit lines. The data read lines are coupled to compensated current source loads, and the differential amplifiers are couplled to switching transistors which are also compensated for transistor characteristic changes, Each bit line pair has a sneak capacitance prevention transistor so that in non-selected columns the bit line pairs are coupled together allowing the memory cells therein to pull down all of the bit lines. This isolates the read lines from unwanted capacitance in the differential amplifiers of each of the non-selected columns, Further, a VCC protection circuit is provided.

16 Claims, 2 Drawing Sheets

OTHER PUBLICATIONS

IEEE Journal of Solid–State Circuits, vol. SC–13, No. 5, Oct., 1978, pp. 635–639; IEEE, New York; Toshio Wada, et al.: "A 15–ns 1024–Bit Fully Static MOS RAM" (p. 636, Col. 2, Lines 13–15, FIG. 3).

IEEE Journal of Solid–State Circuits, vol. SC–13, No. 5, Oct., 1978, pp. 669–676; IEEE, New York; T. P. Haraszti: "CMOS/SOS Memory Circuits for Radiation Environments".

IEEE Journal of Solid–State Circuits, vol. SC–11, No. 3, Jun., 1976, pp. 352–359; IEEE, New York; R. Remshardt, et al.: "A High Performance Low Power 2048–Bit Memory Chip in MOSFET Technology and Its Application".

IBM Technical Disclosure Bulletin, vol. 20, No. 12, May, 1978, New York, pp. 5188–5189, V. Marchello, et al.: "Current Switch Bit Line Driver".

IBM Technical Disclosure Bulletin, vol. 13, No. 9, Feb., 1971, New York, pp. 2670–2671, J. G. Surgent: "Insulated Gate Field Effect Transistor Sense Amplifier Latch".

Wada et al, "A 15–ns 1024–Bit Fully Static MOS RAM," IEEE Jour. Solid State Circuits, vol. SC–13, No. 5 (Oct. 1978) pp. 635–639.

BIT LINE AND COLUMN CIRCUITRY USED IN A SEMICONDUCTOR MEMORY

Matter enclosed in heavy brackets [ ] appears in the original patent but forms no part of this reissue specification; matter printed in italics indicates the additions made by reissue.

This is a continuation-in-part of Ser. No. 534,484 filed Sep. 21, 1983, now abandoned, whose disclosure is hereby incorporated by reference.

BACKGROUND OF THE INVENTION

The present invention is converned with improving the access time to memory cells in a random access memory. The preferred embodiment described herein deals with circuitry implemented on a 64K CMOS static RAM.

Some of the delays in reading a memory cell in a static RAM comprise the cell-select time which corresponds to the time required to operate the address buffer and decoder followed by the word line delay. A subsequent delay is the cell-read time which corresponds to the time required for the sense amplifier and output buffer operation. In a 16K static RAM, the cell select time as defined is about 68% of the total delay and the cell-read time is the remaining 32%.

As static RAM density is increased, the cell-read time has become a larger percentage of the total access time. Considering a 64K static RAM, the cell-select time is about 58% and the cell-read time is about 42% of the total. Reasons for this increased percentage of total delay attributed to the cell-read time are that the bit line signal is reduceed due to weaker memory cell transistors and there is a larger bit line capacitance.

The principal object of the present invention is to reduce the cell-read time.

SUMMARY OF THE INVENTION

The foregoing object is achieved by adding bit line loading which in the preferred embodiment comprises a combination of a compensated current source to increase the bit line signal and a clamp device for insuring cell stability. Column sense amplifiers according to various aspects of the invention use switched compensated current sources to maximize gain and improve data line level stability. Separate read and write data paths are added. Sneak capacitance reduction means reduces capacitance due to non-selected columns.

BRIEF DESCRIPTION OF THE DRAWINGS

In describing the preferred embodiment, reference will be made to the accompanying drwings wherein.

DETAILED DESCRIPTION

Figure 1:
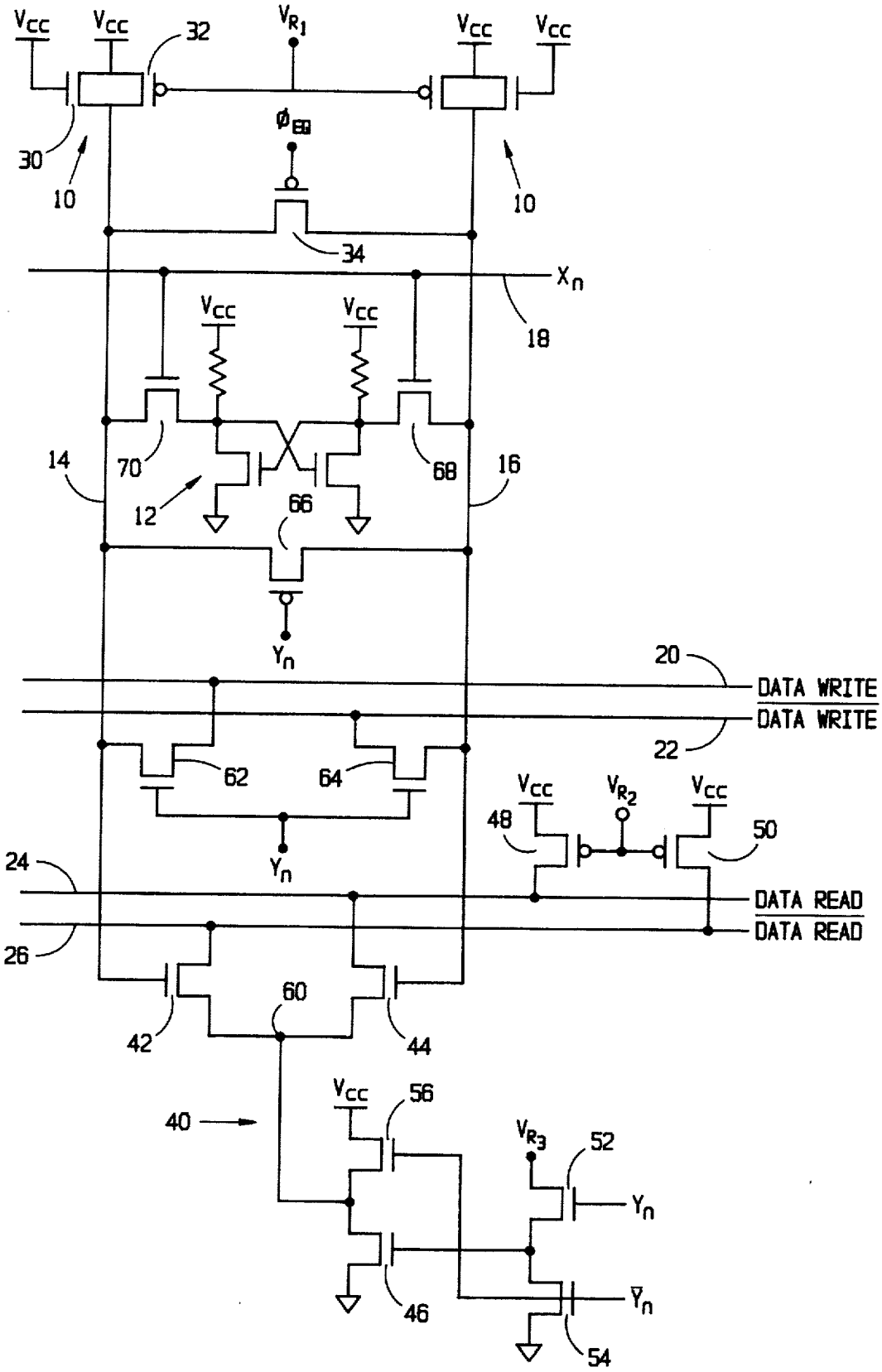
FIG. 1 illustrates bit line circuitry and some of the improved column circuitry including column read and write circuitry with a control circuit, all according in aspects of the present invention.

Referring to FIG. 1, column circuitry for a typical memory cell of the bi-stable flip-flop configuration is shown. Basically, FIG. 1 shows bit line load circuitry 10, a memory cell 12, bit lines 14 and 16 coupled to a column of memory cells, a word line 18 for a row, data write lines 20 and 22, separate data read lines 24 and 26, and a column amplifier 40. The column includes plural memory cells, and there are plural such columns with such circuitry in the memory, with the exception that current source loads are shared, as described infra.

Bit line circuits 10 in combination with memory cell 12 permit a differential voltage to develop quickly on the bit lines 14 and 16 and preserve cell stability by preventing the bit line voltages from dropping too low. Also, circuits 10 (with the reference voltage VR1) provide high voltage gain independent of transistor characteristics.

In circuit 10, a clamp formed by transistor 30 cooperates with a current source formed by a P-channel transistor 32 and a reference voltage VR1. Transistor 30, which is N-channel, has its source coupled to bit line 14 and its drain coupled to a source of operating voltage, in this case VCC which is 5.0 volts. The P-channel transistor 32 has its source coupled to VCC and its drain coupled to bit line 14. The gate of transistor 30 is coupled to VCC. The gate of transistor 32 is coupled to the reference voltage VR1 which is a variable voltage generated on chip. The circuitry which generates VR1 compensates for changes in both N-channel transistors and P-channel transistors as occur in CMOS. This will be described in connection with FIG. 2. However, VR1 is a DC voltage which changes value depending on ambient conditions. It tracks with the transistor parameters and supplies a voltage to the gate of transistor 32 so that the transistor provides a relatively constant current source to the bit line. Circuits 10, each having a current source and clamp, are provided for each of the two bit lines 14 and 16 in the illustrated embodiment.

The semiconductor industry generally does not use P-channel transistors as a current source. Instead, it uses N-channel transistors or depletion mode transistors with each gate tied to the bit line. Such arrangements provide little clamping and do not track. The present arrangement combines the features of bit line clamping together with tracking to provide an improved device.

To read the memory cell 12, an equalizing signal is applied to turn on a transistor 34 whose source-drain path is coupled to the bit line pair 14 and 16. This will equalize the bit lines at about 4.0 volts. *When the equilibrating clock signal turns off, transistor 34 is rendered non-conductive and voltage on the bit lines 14, 16 will depend on the memory cell 12 (when selected), the column amplifier, and the bit line loads 10. The effect of the bit line loads will first be considered.* At this time, with respect to the circuit 10, the P-channel transistor 32 will be on, and the clamp formed by transistor 30 will not yet be on because transistor 30 is constructed so that its threshold voltage is about 1.5 volts. In this arrangement, then, transistor 30 does not turn on until the bit line is about 1.5 volts below VCC. Thus, while the gate and drain of transistor 30 will be high, the transistor will not turn on because the bit lines will have been equalized at about 4 volts which does not provide an adequate low-voltage on the source of transistor 30 to turn the transistor on. Thus, at this time, transistor 32 provides a substantially constant current source relatively independent of bit line voltage. [The] *Since each bit line 14, 16 has a corresponding bit line load, as shown in FIG. 1, both of the bit lines will*

*have a tendency to be pulled toward VCC by the action of the current sources, i.e. transistors 32. However, in the selected row $X_n$,* the transistors 68, 70 are turn ON to couple the memory cell 12 to bit lines 14, 16. Since the data stored in the memory cell is binary, one of the flip-flop transistors in the cell will be ON and will couple the corresponding internal cell node, and consequently the corresponding bit line 14 or 16, to ground. As a result, the memory cell 12 will attempt to modulate the current on one of the bit lines. *Since device 32 is a P-channel transistor, when it is in saturation it acts as a constant current source, as is well known. In the saturation region, the current delivered to the drain of FET 32 will be independent of the drain voltage and will be a function of the gate to source voltage of FET 32. Hence, under appropriate conditions a substantially constant current flows through each FET 32 to its respective bit line.* Because the current source supplies approximately constant current, the bit line voltage must change greatly. As the bit line changes, the difference in voltage between the bit lines 14 and 16 will be read. A delta of about 0.1 volts is enough to read the cell. [When the equilibrating clock turns off, one of the bit lines] *As previously mentioned, when the equilibrating signal is turn OFF, transistor 34 is thereby rendered non-conductive and the bit lines are no longer coupled to each other. One of the bit lines 14, 16* moves toward VCC as a result of its P-channel transistor being on. The other bit line will move toward ground through the operation of the memory cell 12. As the voltage drops on the bit line toward ground, at some time there will be a voltage differential sufficient for the clamp transistor 30 to turn on. This occurs at a voltage on the bit line of about 3.5 volts. The memory cell will pull the bit line down to about 3 volts, but the clamp will prevent it from dropping further. (Prior to this occurring the cell will have been read.) By preventing the voltage on the bit lines from dropping too low, the danger of flipping memory cells is substantially reduced.

The lower portion of FIG. 1 illustrates the column read and write circuitry. As can be seen, write lines 20 and 22 are separate from read lines 24 and 26. In this figure, the column select signal is Yn. When Yn is high, the column is selected to be read or written into. A differential column amplifier 40 is show including input transistors 42 and 44, an N-channel transistor 46 which acts as a current source to the sources of input transistors 42 and 44, and P-channel transistors 48 and 50 whose gates are both coupled to a second voltage reference VR2. Transistors 48 and 50 act as nearly ideal current source load providing, independent of read line voltage, a nearly constant current.

Transistors 52 and 54 are switching transistors acting as a control circuit. They switch the gate of transistor 46 between VR3 and ground depending on the state of Yn. When Yn is low, the gate of transistor 46 is low because of transistor 54 which turns on a path to ground. Also, when Yn is low, this turns on a transistor 56 which pulls a node 60 to within one threshold voltage of VCC. Transistor 56 is a clamp transistor which holds node 60 at NCC minus Vtn when Yn is low.

While reading from the cell, the data write line 20 and its complement 22 are held at VCC. The bit line voltages drive the column sense amplifier 40. This creates output signals on the data read lines 24 and 26 which are sensed by a main read amplifier (not shown).

To write data into the memory cell 12, lines 20 or 22 are pulled to near ground by driver circuitry which pulls down a selected bit line via transistors 62 or 64.

It will be noted that P-channel transistors 48 and 50 for the data read buses 24 and 26 are to be shared by a number of columns each having a column amplifier arrangement as illustrated by transistors 42, 44, 46, 52, 54 and 56.

FIG. 1 also includes a P-channel transistor 66 whose gate is coupled to the column select signal Yn. This transistor is concerned with sneak paths. In a large RAM, data read lines 24 and 26 will be coupled to the transistors 42 and 44 of each column. Consider the columns other than the column containing the cell which is to be read. For each of those nonselected columns, when the word line 18 for the addressed memory cell goes high, it will couple not only the addressed cell to its bit lines, but also a plurality of adjacent memory cells to their corresponding bit lines. As a result, each column along the work line 18 will have a bit line 14 or 16 which will be at VCC. Bit lines 14 and 16 are connected to the gates of their corresponding transistors 42 and 44. As a result, in each nonselected column, the gate of a transistor 42 or 44 will be at VCC. Now, when the data read line 24 or 26 is lower than VCC minus Vth (where Vth represents a threshold voltage for an N-channel transistor), then a transistor 42 or 44 will turn on. This will occur in each nonselected column. As a result, a data read line 24 or 26 would then be coupled to the nodes 60 in all of the nonselected columns, and this would increase the capacitive loading on the data read lines significantly and reduce the speed of the RAM.

To overcome this problem, each column includes a transistor 66 whose source-drain path selectively couples the bit lines 14 and 16. The gate of transistor 66 is coupled to the column select signal Yn, which is high when the column is selected. Transistor 66 is illustratively a P-channel device, so that when a column is selected (Yn is high), the transistor 66 for the selected column will be off. However, the transistors 66 in the nonselected columns will be on. Because such memory cell 12 along the active word line normally pulls down one of the bit lines 14 or 16 in its own column, when a transistor 66 is on in that column, such memory cell will pull down both of the bit lines below VCC. This keeps transistors 42 and 44 turned off in all of the nonselected columns and eliminates the extra capacitance and problems associated with it.

Figure 2:
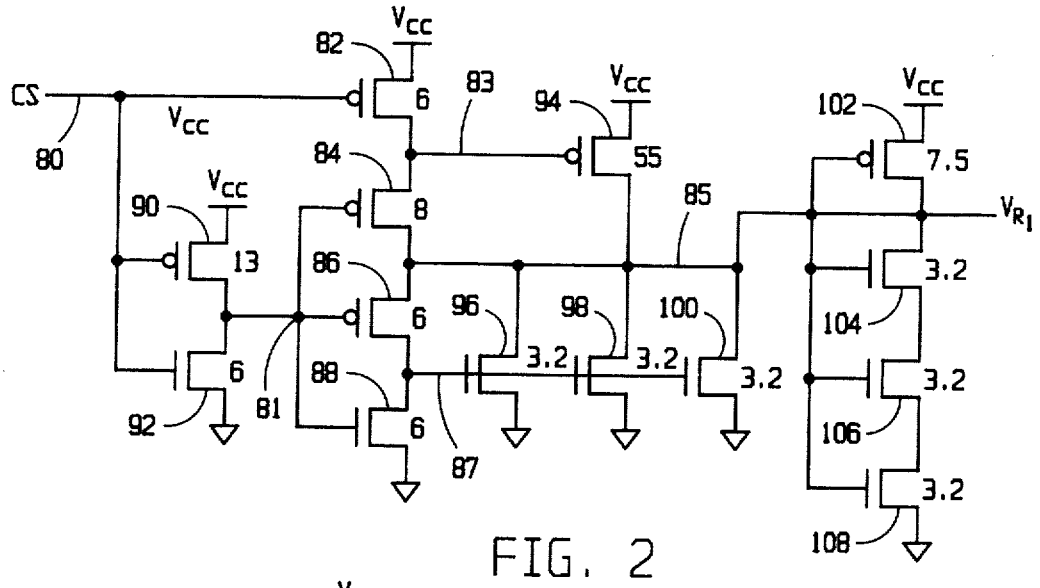
FIG. 2 illustrates a reference voltage generator for supplying the reference voltage VR1 employed in the circuitry of FIG. 1.
Figure 3:
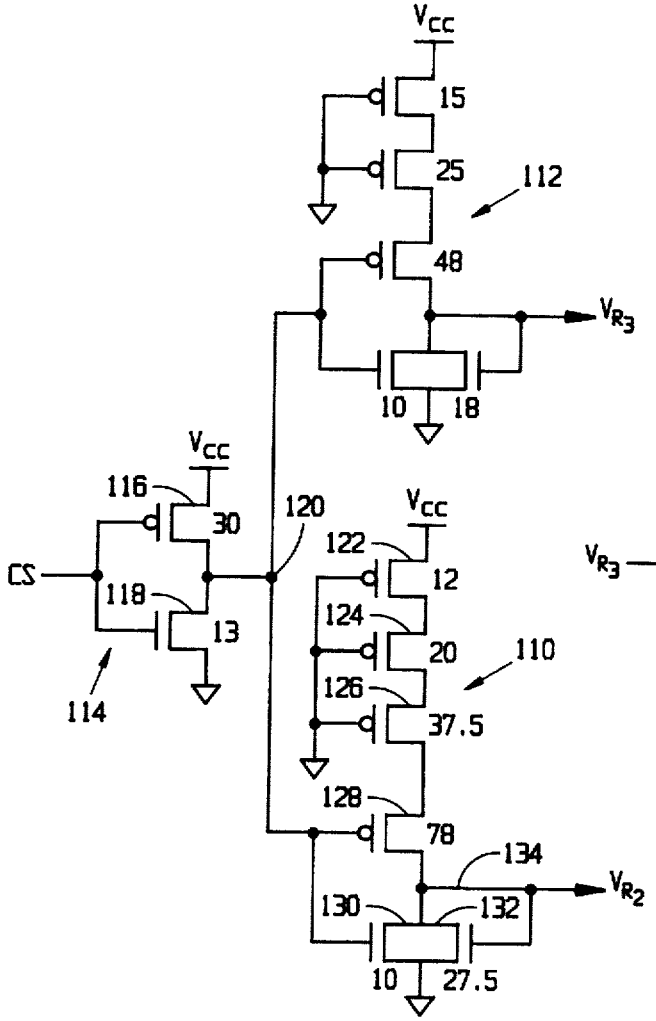
FIG. 3 illustrates a reference voltage generator for supplying reference voltages VR2 and VR3.

The reference voltages of the preferred embodiment are generated by circuits shown in FIGS. 2 and 3. Each of these circuits receives a chip select signal CS. Also, each of these circuits includes both P channel and N channel transistors for modeling transistor characteristic changes in the circuitry of FIG. 1. The circuits of FIG. 1 through 4 are all constructed on a single chip.

In FIG. 2, the chip select signal CS is coupled to a line 80. When CS is low, an output 81 of an inverter formed by transistors 90 and 92 is high. This will turn off P-channel transistors 84 and 86 and turn on N-channel transistor 88. The source-drain path of transistor 88 pulse node 87 to ground. Node 87 is coupled to the gates of N-channel transistor 96, 98 and 100 which therefore are turned off.

Further, when CS is low, P-channel transistor 82 is turned on to pull node 83 to VCC. The source-drain path of transistor 82 pulls node 83 to VCC. Node 83 is coupled to the gate of a P-channel transistor 94 which therefore is turned off. It will be appreciated that transistors 94, 96, 98 and 100 consume power and are therefore turn off when the chip select signal CS is low. When these transistors are off, P-channel transistor 102 and N-channel transistors 104, 106 and 108 hold a node 85 [rear] *near* a voltage of about 3 volts (where VCC is 5 volts). Transistors 102 through 108 are small transistors and require low power. Node 85 provides the reference voltage VR1.

When the chip select signal goes high, transistor 82 is turned off. The output 81 of the inverter formed by transistors 90 and 92 goes low so that transistors 84 and 86 turn on and transistor 88 turns off. Nodes 83 and 87 will then be connected to node 85. P-channel transistor 94 is turned on, and transistors 96, 98 and 100 will be turned on. This arrangement provides a self-biased inverter with the output node 85 connected to input nodes 83 and 87. Output node 85 provides a reference voltage *VR1* which tracks with the P-channel transistor characteristics which are molded by P-channel transistor 94. Further, the memory cell pass transistors 68 and 70 will be molded by transistors 96, 98 and 100. Thus, the output VR1 tracks with changes in both P-channel and N-channel transistors, and this allows biasing of the bit lines 14 and 16 independent of transistor characteristics. If P-channel transistor 32 of FIG. 1 changes characteristics, transistor 94 will also change characteristics, it being on the same chip, and the load to the bit lines is compensated. The same is true for transistors 68 and 70 vis-a-vis transistors 96 through 100.

Preferably, the reference voltage VR1 drives plural columns. In the preferred embodiment, two generators, each as shown in FIG. 2, are used for a 64K CMOS static RAM.

FIG. 3 illustrates circuitry for providing reference voltages VR2 and VR3 for the column amplifier. The chip select signal in the generator of FIG. 3 is applied to an inverter 114 comprising transistors 116 and 118. When the chip select signal is low, the output 120 of inverter 114 is high. Output 120 is applied to the gates of P-channel transistors and N-channel transistors in stages 110 and 112. Thus, when CS is low, P-channel transistor 128 is turned off and N-channel transistor 130 is turned on to pull a node 134 to ground via the source-drain path of transistor 130. Node 134 provides the reference voltage VR2. Additionally, when the chip select signal CS is low, the current path of VCC to ground in stage 110 through the source-drain paths of the transistors 122, 124, 126, 128 and 130 is turned off.

When the chip select signal CS is high, the node 120 goes low which turns on transistor 128 and turns off transistor 130. The voltage at node 134 rises to a potential determined by the relative sizes of transistors 122, 124, 126 and 128 relative to the size (width) of N-channel transistor 132 whose gate is coupled to node 134. There will be a current from VCC to ground in stage 110, therefore, when CS is high.

In stage 110, instead of using a single P-channel transistor for modeling the characteristics of P-channel transistors, multiple P-channel transistors 122, 124, 126 and 128 are used. This is to ensure that they are each biased in the linear region, which minimizes the drain to source voltage across each of those transistors. Transistors 48 and 50 in FIG. 1 also are biased in the linear region. Thus, reference voltage VR2 will track correctly with P-channel characteristics.

Stage 112 in FIG. 3 is the same as stage 110 except that it has one P-channel transistor fewer. This is because reference voltage VR3 is at a higher potential than reference voltage VR2. This alleviates the need for the extra transistor to ensure that they all stay in the linear region.

Figure 4:
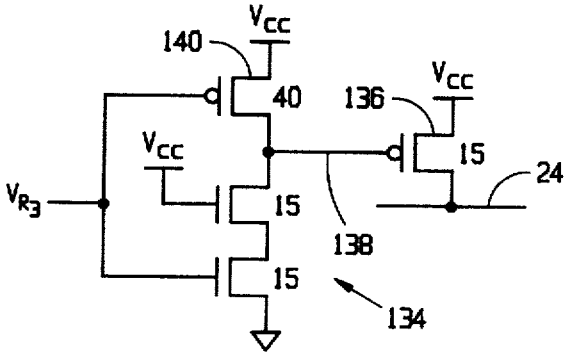
FIG. 4 illustrates a low VCC protection circuit.

In the preferred embodiment, VCC is 5 volts, reference voltage VR1 is about 3 volts, reference voltage VR2 is about 1.7 volts, and reference voltage VR3 is about 2.2 volts. This embodiment provides protection circuitry so that when VCC is below the expected 5 volt level, the parts should still operate. Such protection circuit is shown in FIG. 4. It includes a circuit 134 cooperating with a P-channel transistor 136. When VCC drops, data read line 24 tends to drop too low because transistors 48 and 50 becomes biased in the saturation region instead of the linear region.

To safeguard against this, circuit 134 models a column amplifier 40. As VCC lowers, a node 138 in circuit 134 drops low before the data read lines 24 and 26 drop low. Node 138 drops low before data read line 24 drops low because the gate of a transistor 140 is driven by reference voltage VR3 instead of VR2. This assures that transistor 140 enters saturation before transistors 48 and 50 (FIG. 1) enter saturation as VCC drops. When node 138 goes low, transistor 136 turns on to restrain line 24 from dropping too low. If the supply voltage VCC were to drop to 3 volts and the protection circuit of FIG. 4 was not used, then data read line 24 would crash to about 0.5 volts. However, by including the protection circuit of FIG. 4, line 24 will be held to about 2 volts.

The present invention has been described in terms of a preferred embodiment which is illustrative. Other circuits are within the scope of the invention which is defined by the following claims.

I claim:

1. In a CMOS integrated circuit device, a memory array and control circuitry therefor comprising:

a plurality of pairs of column lines;

a plurality of word lines;

a plurality of multi-transistor memory cells, each cell including a pair of cross-coupled N-channel transistors and being located at an intersection of, and connected to, a pair of column lines and one said word line;

a plurality of bias [means] *circuite* each connected to a corresponding column line, each [said] bias *circuit* ]means] including a P-channel transistor and an N-channel transistor each having its source-drain path coupled between a supply voltage and [said] *a* corresponding column line, each [said] bias [means serving to limit the current drain to the threshold level of said P-channel transistor] *circuit being arranged to limit the voltage swing on the corresponding column line* as the *corresponding* column line for the particular bias [means] *circuit* is pulled toward ground; and a voltage reference circuit [connected] *coupled* to said supply voltage [input] and having an output connected to the gates of said P-channel transistors for each pair of [said] bias [means] *circuits* connected to a pair of column lines, said reference circuit providing compensation means for reducing the effects of [process variations between elements of said] *changes in the ambient conditions within the integrated circuit* device.

2. The integrated circuit device of claim 1 wherein each said memory cell is a cross-coupled latch circuit comprised of four N-channel transistors.

3. The circuit of claim 1 wherein said voltage reference circuit includes a self-biased inverter including a P-channel transistor and an N-channel transistor.

4. In a CMOS integrated circuit device, a memory array and control circuitry therefor comprising:

a plurality of pairs of column lines, each pair constituting a bit line and a bit bar line;

a plurality of work lines extending transverse to said pairs of column lines;

a plurality of multi-transistor memory cells, each cell being located at an intersection of, and connected to, one word line and one pair of columns lines;

a plurality of bias [means] *circuits* , each connected to one end of a corresponding column line, each [said] bias

[means] *circuit* including a P-channel transistor and an N-channel transistor, each *of said transistors* having its source-drain path connected between a supply voltage and [the] *a* corresponding column line, each [said] bias [means being operative for limiting the current drain to the threshold level of said P-channel transistor] *circuit being arranged to limit the voltage swing on the corresponding column line* as the corresponding column line for the particular bias [means] *circuit* is pulled toward ground; and a voltage reference circuit having an output connected to the gates of the P-channel transistors for the bias [means] *circuits* for [column line pairs] *said pairs of column lines* , said reference circuit having transistor elements sized to mirror transistor elements of said bias [means] *circuits* and said memory cells and thereby compensate for [process variation within said] *changes in the ambient conditions within the integrated circuit* device.

5. The circuit device according to claim 4 wherein said voltage reference circuit is comprised of a first P-channel transistor having its drain connected to *a* first [a] source voltage and three N-channel transistors having their source drain paths coupled in series between the source of said first P-channel transistor and a reference potential.

6. The column circuitry according to claim 4 wherein said voltage reference circuit includes P-channel transistors and N-channel transistors to provide a first reference voltage which varies to compensate for changes in the ambient conditions within the semi-conductor memory.

7. In a semi-conductor memory having at least two columns of memory cells for storing data, each column having a pair of bit lines coupled to plurality of memory cells, said memory having a pair of data read lines and having address means for providing a column select signal to each column, column circuitry comprising:

a respective differential amplifier for each of said columns, each said differential amplifier being coupled between said read lines and the pair of bit lines in the corresponding column, each differential amplifier being responsive to an associated column select signal to provide output signals on the read lines representative of the data stored in one of the memory cells in the corresponding columns when the column is selected; and Sneak capacitance reduction means coupled between the pair of bit lines in each of columns and responsive to a column select signal for coupling together the pair of bit lines in a corresponding column when the corresponding column is not selected.

8. The column circuity according to claim 7 wherein said sneak capacitance reduction means includes, for each column, a transistor having its source/drain path coupled between the bit lines in the corresponding column and having its gate coupled to a select signal.

9. In a CMOS integrated circuit device, a memory array and control circuitry therefor comprising:

a plurality of pairs of bit lines;

a plurality of word lines extending transverse to said pairs of bit lines;

a plurality of multi-transistor memory cells, each cell including a pair of cross-coupled transistors and being located at an intersection of, and connected to, a corresponding pair of bit lines and a corrsponding word line;

a plurality of bias circuits coupled to said bit lines, each one of said bit lines corresponding to a respective bias circuit, each [said] bias circuit including a P-channel transistor and *an* N-channel transistor coupled to each other and coupled between a supply voltage and the corresponding bit line, [said] *each* bias circuit providing a clamp and a current source for the bit line corresponding to [the] *that* bias circuit; and a voltage reference circuit coupled to said supply voltage and having an output coupled to the gate electrodes of said P-channel transistors in said plurality of bias circuits, said reference circuit reducing the effects of [process variations between elements of said] *changes in the ambient conditions within the integrateed circuit* device.

10. The integrated circuit device of claim 9 wherein each said memory cell comprises a cross-coupled latch circuit having four N-channel transistors.

11. The integrated circuit device of claim 9, said reference circuit having elements sized to track [the] effects [of] *on* transistor elements of the plurality of bias circuits and said memory cells and thereby compensate for [process variations within said] *changes in the ambient conditions within the integrated circuit*device.

12. The circuit device according to claim 9 wherein said voltage reference circuit comprises a first P-channel transistor having its source-drain coupled between a first source voltage and said output of said voltage reference circuit, and further comprises three N-channel transistors having their source-drain paths coupled in series between a reference potential and said ouptut.

13. The circuit of claim 9 wherein said voltage reference circuit includes a self-biased inverter including a P-channel transistor and an N-channel transistor.

14. The column circuitry of claim 9 wherein said voltage reference circuit provides a non-zero voltage to the gate electrodes of said P-channel transistors in said plurality of bias circuits.

15. The column circuitry of claim 9 wherein said semiconductor memory includes a pair of data read lines coupled to a plurality of pairs of input transistors each gated by a corresponding bit line and each selectively coupling a respective data read line to a common node between an associated pair of input transistors, whereby each column comprises a pair of bit lines and has associated with it a respective common node selectively coupled to the data read lines; the column circuitry further comprising a current source load coupled to said data read lines and to a second voltage reference circuit which provides a second reference voltage which varies to compensate for changes in the ambient conditions within the semi-conductor memory.

16. The memory according to claim 15 further comprising a plurality of sneak capacitance reduction means each coupled between a respective pair of said bit lines and being responsive to a column select signal to couple the bit line pair together to permit the memory cell therebetween to isolate said read lines from each of said common nodes except for the common node in the selected column.

* * * * *